United States Patent
Teno

(10) Patent No.: US 9,768,685 B2
(45) Date of Patent: Sep. 19, 2017

(54) BOOTSTRAP CIRCUIT

(71) Applicant: Rohm Co., Ltd., Kyoto (JP)

(72) Inventor: Yoshihiro Teno, Kyoto (JP)

(73) Assignee: Rohm Co., Ltd., Kyoto (JP)

( * ) Notice: Subject to any disclaimer, the term of this patent is extended or adjusted under 35 U.S.C. 154(b) by 0 days.

(21) Appl. No.: 14/849,733

(22) Filed: Sep. 10, 2015

(65) Prior Publication Data

US 2016/0079848 A1    Mar. 17, 2016

(30) Foreign Application Priority Data

Sep. 11, 2014 (JP) .................................. 2014-185280

(51) Int. Cl.
- G05F 1/10 (2006.01)
- H02M 3/07 (2006.01)
- G11C 5/14 (2006.01)
- G11C 8/08 (2006.01)
- H02M 1/00 (2006.01)

(52) U.S. Cl.
CPC ............ *H02M 3/073* (2013.01); *G11C 5/145* (2013.01); *G11C 8/08* (2013.01); *H02M 2001/0096* (2013.01)

(58) Field of Classification Search
CPC ......... H02M 3/073; H02M 3/07; G11C 16/12; G11C 16/30
See application file for complete search history.

(56) References Cited

U.S. PATENT DOCUMENTS

| | | | | |
|---|---|---|---|---|
| 6,493,582 B1 * | 12/2002 | Ripart | .................. | A61N 1/3622 |
| | | | | 607/9 |
| 2005/0237848 A1* | 10/2005 | Takahashi | .............. | G11O 5/145 |
| | | | | 365/232 |
| 2009/0184239 A1* | 7/2009 | Jeong | ........................ | G01J 1/44 |
| | | | | 250/214 R |
| 2013/0120030 A1* | 5/2013 | Kora | .................. | H03K 17/0822 |
| | | | | 327/109 |
| 2013/0194033 A1 | 8/2013 | Murakami et al. | | |

FOREIGN PATENT DOCUMENTS

| | | |
|---|---|---|
| JP | 61-82529 | 4/1986 |
| JP | 04-195992 | 7/1992 |
| JP | 06-97794 | 4/1994 |
| WO | 2012/029874 | 3/2012 |

\* cited by examiner

*Primary Examiner* — Sibin Chen
(74) *Attorney, Agent, or Firm* — Fish & Richardson P.C.

(57) ABSTRACT

Bootstrap circuit includes: a first transistor of first conductivity type having a first main electrode, a second main electrode and a control electrode connected to a first power supply terminal, a first node, and a second node, respectively; a second transistor of the first conductivity type having a first main electrode, a second main electrode, and a control electrode connected to the first power supply terminal, the second node and the first node, respectively; a first capacitor having a first end connected to the first node and a second end where a first boost pulse is applied; a second capacitor having a first end connected to the second node and a second end where a second boost pulse having opposite polarity to the first boost pulse is applied; and a boost output terminal which outputs boost voltage higher than first power supply voltage supplied to the first power supply terminal.

20 Claims, 10 Drawing Sheets

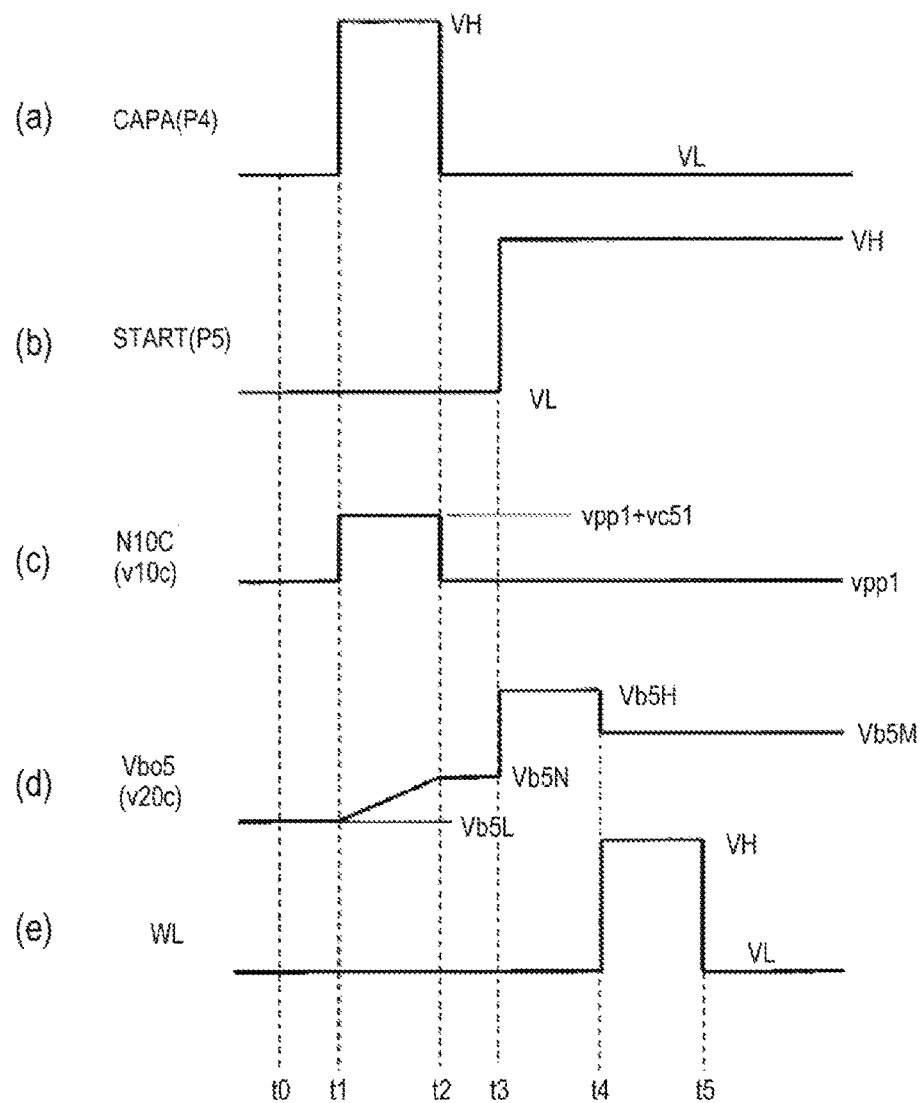

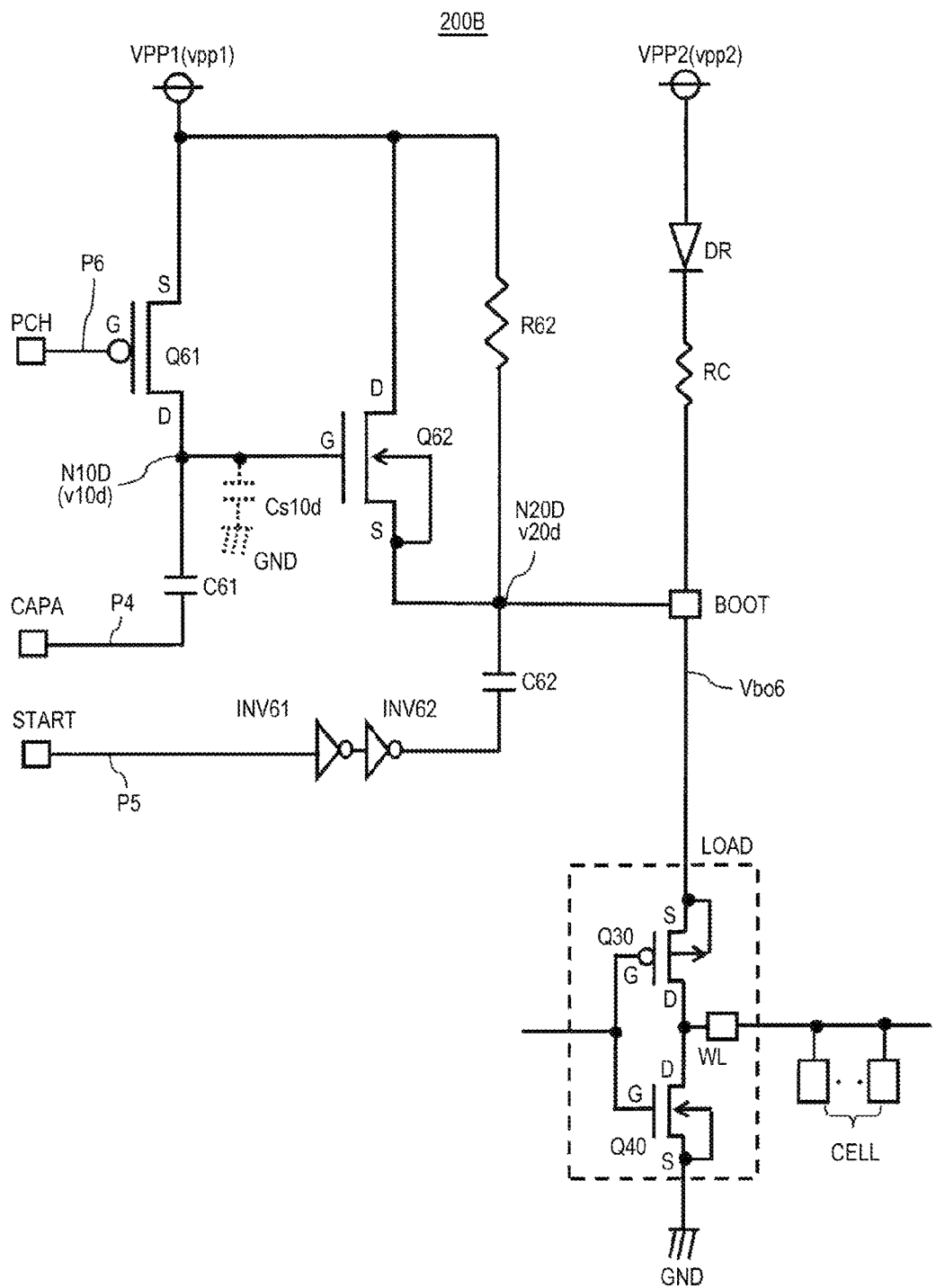

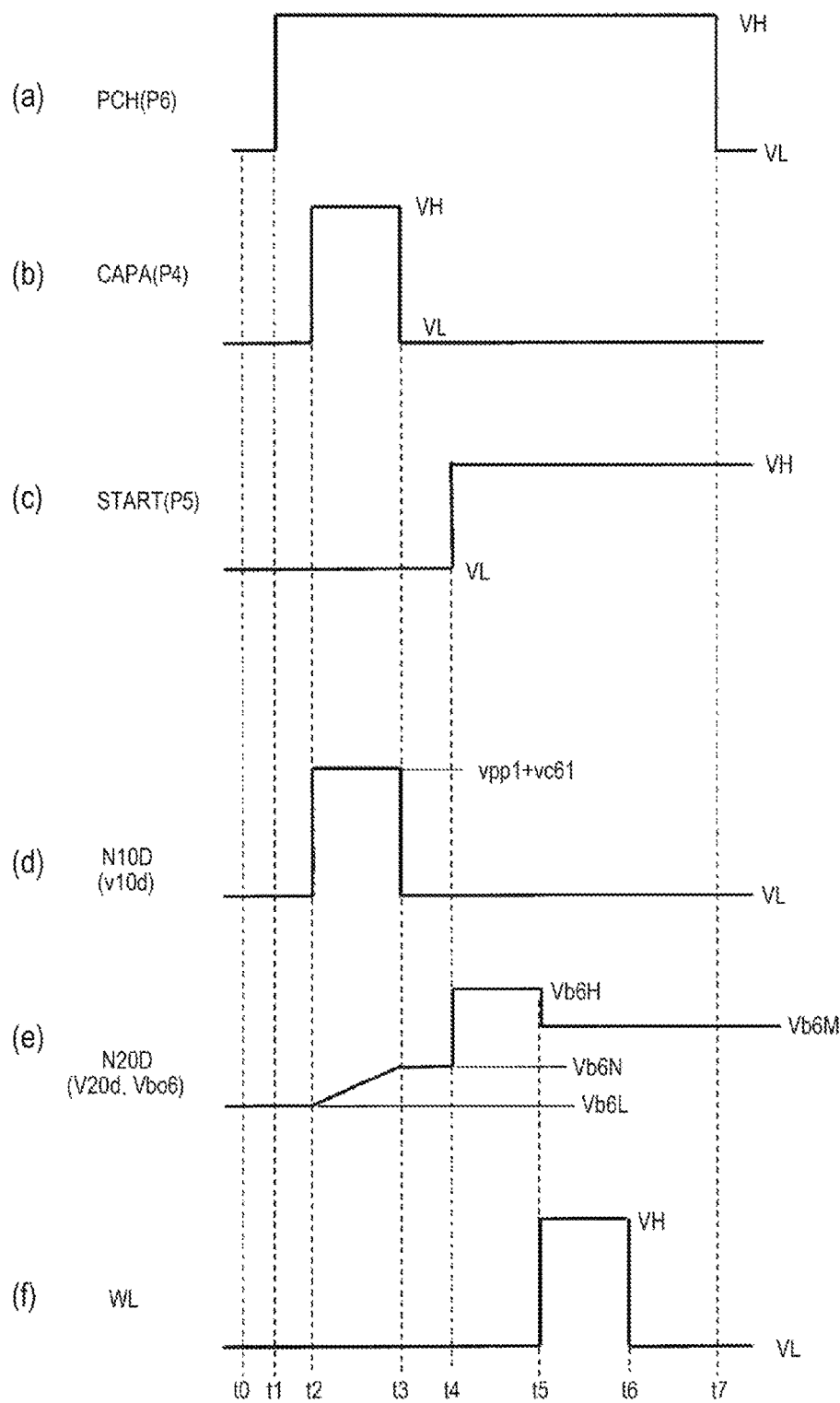

BOOTSTRAP CIRCUIT

CROSS-REFERENCE TO RELATED APPLICATIONS

This application is based upon and claims the benefit of priority from Japan Patent Application No. 2014-185280, filed on Sep. 11, 2014, the entire contents of which are incorporated herein by reference.

TECHNICAL FIELD

The present disclosure relates to a bootstrap circuit for stepping up (boosting) a voltage to a power supply voltage or more.

BACKGROUND

A bootstrap circuit is, for example, used for a word line driver for a memory, DRAM, or the like.

A word line boosting method may be used as a method for applying a voltage, which is equal to or more than a power supply voltage plus a threshold voltage, to a word line and writing a power supply voltage in a memory cell connected to the word line in order to improve noise-resistance characteristics and an operation margin of DRAM.

A semiconductor integrated circuit device may include a boost circuit. For example, in the boost circuit, an n-channel MOSFET for charging and an n-channel MOSFET for discharging may be arranged at a node to be boosted. Further, one end of a capacitor for stepping up a voltage is connected to the node to be boosted. The other end of the capacitor for stepping up a voltage is connected to a substrate bias power supply, which corresponds to a reference electric potential, via a first switch circuit. Specifically, the first switch circuit may be constituted by a flip-flop including two n-channel MOSFETs, which have their sources connected in common to the substrate bias power supply and their gates cross-connected to each other, and an n-channel MOSFET of a load. The boost circuit may also have a second switch circuit using an n-channel MOSFET. With this configuration, the node may be boosted by turning on/off the two MOSFETs constituting the first switch circuit, and thus, inverting the flip-flop.

A bootstrap circuit for providing an output voltage which is twice as large as a power supply voltage in response to a timing signal of a single input may be used in a word line driver circuit of a memory for a data processor. Specifically, an input timing signal may be supplied to gates of the first and the second FETs which are alternately turned on/off to change the state of the first and the second output nodes of the first and the second latches. Depending on the first and the second output nodes, a capacitor is charged to the power supply voltage when the third and the fourth FETs connected to a power supply are turned on. Further, an output corresponding to the sum of the power supply voltage and the charged voltage may supplied to a load when a fifth FET is turned on (with the third and the fourth FETs turned off).

A signal processing circuit which can maintain an output electric potential even after a bootstrap effect is lost may be provided. For this purpose, a resistor may be connected between an output terminal and a power supply.

SUMMARY

The present disclosure involves the above-described technical field. The above-described circuits have a relatively complicated circuit configuration and do not suggest the technical idea of adjusting a boost voltage. The present disclosure provides some embodiments of a bootstrap circuit with a relatively simple circuit configuration, which is capable of generating a desired boost voltage and adjusting the boost voltage with ease.

According to one embodiment of the present disclosure, there is provide a bootstrap circuit including: a first transistor of a first conductivity type having a first main electrode, a second main electrode and a control electrode which are connected to a first power supply terminal, a first node, and a second node, respectively; a second transistor of the first conductivity type having a first main electrode, a second main electrode, and a control electrode which are connected to the first power supply terminal, the second node and the first node, respectively; a first capacitor having a first end connected to the first node and a second end to which a first boost pulse is applied; a second capacitor having a first end connected to the second node and a second end to which a second boost pulse having the opposite polarity to the first boost pulse is applied; and a boost output terminal which outputs a boost voltage higher than a first power supply voltage supplied to the first power supply terminal coupled to the second node.

In some embodiments, an anode of a diode is connected to the first node, a cathode of the diode is connected to the second node, and the second node is connected to the boost output terminal.

In some embodiments, the bootstrap circuit further includes: a third transistor of a second conductivity type having a first main electrode, a second main electrode and a control electrode which are connected to the boost output terminal, the first node and the second node, respectively; and a fourth transistor of the second conductivity type having a first main electrode, a second main electrode and a control electrode which are connected to the boost output terminal, the second node and the first node, respectively.

In some embodiments, a first resistor is connected between the first node and the first power supply terminal and a second resistor is connected between the second node and the first power supply terminal.

In some embodiments, at least one of the first resistor and the second resistor is configured in combination of a plurality of unit resistive elements having a predetermined unit resistance.

In some embodiments, at least one of a first resistance of the first resistor and a second resistance of the second resistor is adjustable.

In some embodiments, an adjustable range of the second resistance of the second resistor is wider than an adjustable range of the first resistance of the first resistor.

In some embodiments, the first resistor and the second resistor are fabricated in a semiconductor integrated circuit device and an adjustment of at least one of a first resistance of the first resistor and a second resistance of the second resistor is performed in at least one of a focused ion beam and a wiring process of the semiconductor integrated circuit device.

In some embodiments, at least one of the first capacitor and the second capacitor is configured in combination of a plurality of unit capacitors having a predetermined unit capacitance.

In some embodiments, at least one of a first capacitance of the first capacitor and a second capacitance of the second capacitor is adjustable.

In some embodiments, an adjustable range of the second capacitance of the second capacitor is wider than an adjustable range of the first capacitance of the first capacitor.

In some embodiments, the first capacitor and the second capacitor are fabricated in a semiconductor integrated circuit device and adjustment of at least one of a first capacitance of the first capacitor and a second capacitance of the second capacitor is performed in at least one of a focused ion beam and a wiring process of the semiconductor integrated circuit device.

In some embodiments, a word line driver is coupled to the boost output terminal.

In some embodiments, a diode having an anode connected to the boost output terminal and a cathode connected to a second power supply terminal is connected between the boost output terminal and the second power supply terminal.

In some embodiments, a second power supply voltage applied to the second power supply terminal is equal to or higher than the first power supply voltage.

According to one embodiment of the present disclosure, there is provide a bootstrap circuit including: a transistor of a first conductivity type having a control electrode, a first main electrode and a second main electrode which are connected to a first node, a second node and a first power supply terminal, respectively; a first resistor connected between the first node and the first power supply terminal; a second resistor connected between the second node and the first power supply terminal; a first boost capacitor having a first end connected to the first node and a second end connected to a first boost pulse input terminal; a second boost capacitor having a first end connected to the second node and a second end connected to a second boost pulse input terminal; and a boost output terminal coupled to the second node.

According to one embodiment of the present disclosure, there is provide a bootstrap circuit including: a first conductivity type transistor having a control electrode, a first main electrode, and a second main electrode which are connected to a first node, a second node and a first power supply terminal, respectively; a second conductivity type transistor having a first main electrode and a second main electrode which are connected between the first node and the first power supply terminal, and a control electrode to which a driving pulse is applied; a resistor connected between the second node and the first power supply terminal; a first boost capacitor having a first end connected to the first node and a second end connected to a first boost pulse input terminal; a second boost capacitor having a first end connected to the second node and a second end connected to a second boost pulse input terminal; and a boost output terminal coupled to the second node.

In some embodiments, the second conductivity type transistor is a PMOS transistor.

In some embodiments, the first conductivity type transistor is a depletion type NMOS transistor.

In some embodiments, the bootstrap circuit further includes a second power supply terminal, and a diode is forwardly connected from the second power supply terminal toward the boost output terminal and a load is further coupled to the boost output terminal.

BRIEF DESCRIPTION OF THE DRAWINGS

FIG. 8 is a timing chart of main nodes in FIG. 7.

FIG. 9 shows a bootstrap circuit according to a sixth embodiment of the present disclosure.

FIG. 10 is a timing chart of main nodes in FIG. 9.

DETAILED DESCRIPTION

First Embodiment

Figure 1:
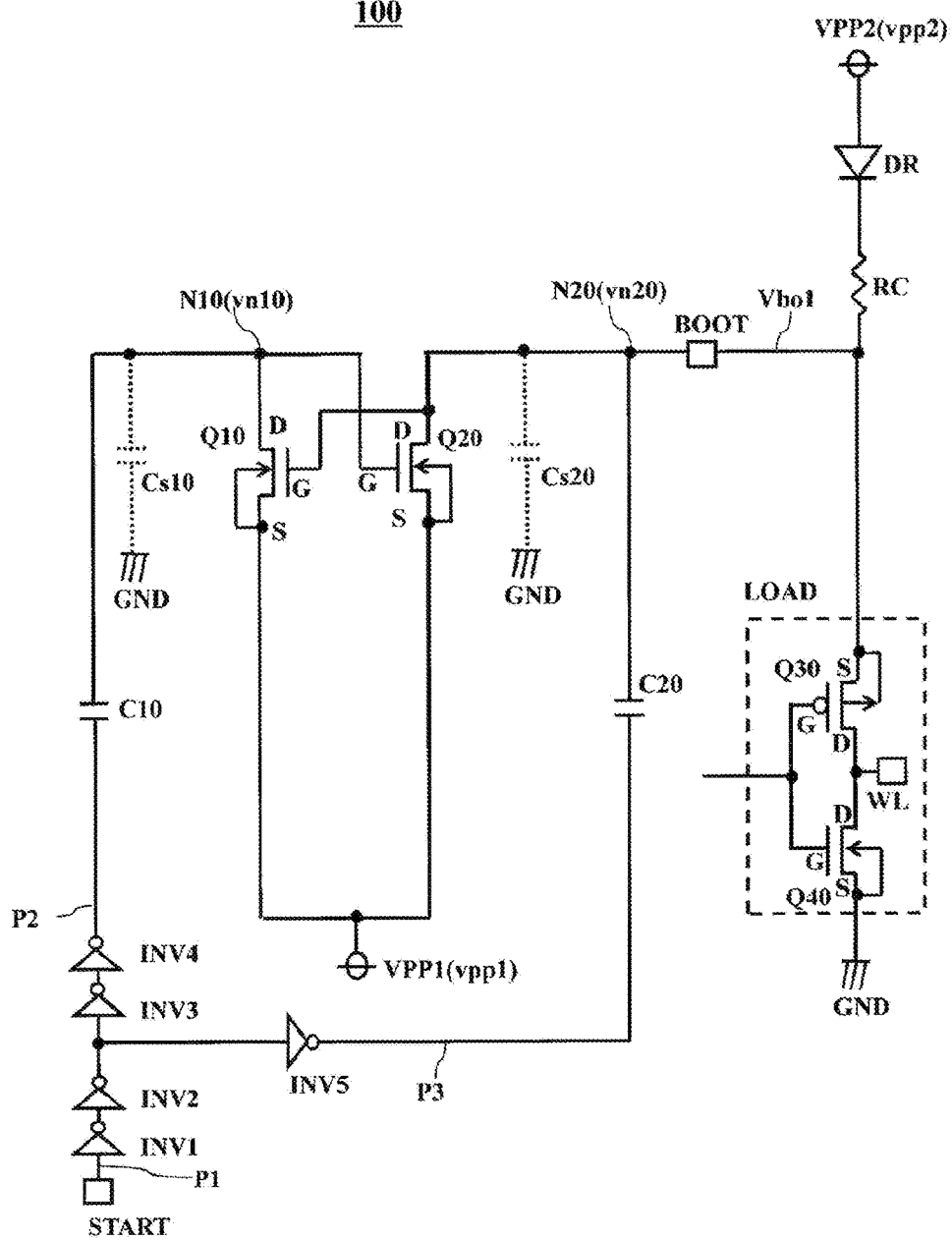
FIG. 1 shows a bootstrap circuit according to a first embodiment of the present disclosure.

FIG. 1 shows a first embodiment of the present disclosure. A bootstrap circuit 100 outputs a boost output voltage Vbo1 to a boost output terminal BOOT based on a signal pulse P1 applied to a boost pulse input terminal START and supplies the boosted or stepped-up boost output voltage Vbo1 to a load LOAD. The load LOAD is, for example, a word line driver used for a flash memory, DRAM, or the like. The bootstrap circuit 100 includes two boost means.

A first boost means includes a transistor Q10, a capacitor C10, and inverters INV1 to INV4. A second boost means includes a transistor Q20, a capacitor C20, the inverters INV1 and INV2, and an inverter INV5. The transistor Q10 and the transistor Q20 constitute a flip-flop which is known in the art. Specifically, a drain D of the transistor Q10 is connected to a gate G of the transistor Q20 and a drain D of the transistor Q20 is connected to a gate G of the transistor Q10. Although the transistors Q10 and Q20 are each constituted by an NMOS transistor in the first embodiment, each of them may be constituted by a PMOS transistor or a bipolar NPN transistor or PNP transistor.

That is, the flip-flop may be constituted by a MOS transistor or a bipolar transistor. In the following description, a source S, a drain D and a gate G of the MOS transistor are referred to as a first main electrode, a second main electrode and a control electrode, respectively. If the flip-flop is constituted by a bipolar transistor, an emitter, a collector and a base of the bipolar transistor may be referred to as a first main electrode, a second main electrode and a control electrode, respectively.

In this embodiment, each of the inverters INV1 to INV5 may be a CMOS inverter with low power consumption and excellent switching characteristics.

A common connection point of the drain D of the transistor Q10 and the gate G of the transistor Q20 is denoted by a node N10 and a common connection point of the drain D of the transistor Q20 and the gate G of the transistor Q10 is denoted by a node N20.

When the bootstrap circuit 100 is formed on a semiconductor substrate, structurally, a parasitic capacitor Cs10 is interposed between the node N10 and a ground electric potential GND and a parasitic capacitor Cs20 is interposed between the node N20 and the ground electric potential GND. Although not shown for convenience of description, a parasitic capacitor is also interposed between the gate G and the drain D of each of the transistors Q10 and Q20 and between the gate G and the source S of each of the transistors Q10 and Q20.

A first end of the capacitor C10 is connected to the node N10 and an output of the inverter INV4 is connected to a second end of the capacitor C10. An output of the inverter INV3 is connected to an input of the inverter INV4, an output of the inverter INV2 is connected to an input of the inverter INV3, an output of the inverter INV1 is connected to an input of the inverter INV2, and the boost pulse input terminal START is connected to an input of the inverter INV1. Therefore, the boost pulse input terminal START and the node N10 are connected in series to the inverters INV1 to INV4 and the capacitor C10. A pulse P1 applied to the boost pulse input terminal START and a pulse P2 drawn from the output of the inverter INV4 have substantially the same amplitude and have the same polarity. Therefore, when the pulse P1 has a high level, the pulse P2 has also a high level, and when the pulse P1 has a low level, the pulse P2 has also a low level. A waveform of the pulse P2 is obtained by shaping a waveform of the pulse P1 by means of the inverters INV1 to INV4. In other words, an appropriate number of inverters INV1 to INV4 are selected in order to shape the waveform of the pulse P1.

An initial value of a voltage vn10 of the node N10 is indefinite. The initial value used herein refers to a voltage when the pulse P1 is not applied to the boost pulse input terminal START, although a power supply voltage vpp1 is supplied to a power supply terminal VPP1 and a power supply voltage vpp2 is supplied to a power supply terminal VPP2. When the pulse P1 is applied to the boost pulse input terminal START and has a low level, the transistor Q10 is turned on and the level of the voltage vn10 of the node N10 becomes substantially equal to the power supply voltage vpp1.

A first end of the capacitor C20 is connected to the node N20 and a second end of the capacitor C20 is connected to the output of the inverter INV5. The output of the inverter INV2 and the input of the inverter INV3 are connected to the inverter INV5. Therefore, the inverters INV1, INV2 and INV5 and the capacitor C20 are connected in series between the boost pulse input terminal START and the node N20. The pulse P1 applied to the boost pulse input terminal START and a pulse P3 drawn from the output of the inverter INV5 have substantially the same amplitude and have opposite polarities. Therefore, when the pulse P1 has a high level, the pulse P3 has a low level, and when the pulse P1 has a low level, the pulse P3 has a high level.

A waveform of the pulse P3 is obtained by shaping the waveform of the pulse P1 by means of the inverters INV1, INV2 and INV5. In other words, the inverters INV1, INV2 and INV5 are arranged in order to shape the waveform of the pulse P1.

An initial value of a voltage vn20 of the node N20 is indefinite like the voltage of the node N10. The initial value used herein refers to a voltage when the pulse P1 is not applied to the boost pulse input terminal START, although the power supply voltage vpp1 is supplied to the power supply terminal VPP1 and the power supply voltage vpp2 is supplied to the power supply terminal VPP2. When the pulse P1 is applied to the boost pulse input terminal START and has a high level, the transistor Q20 is turned on and the voltage vn20 of the node N20 becomes substantially equal to the power supply voltage vpp1.

When the pulse P1 has a low level, the pulse P3 has a high level, an electric potential of the second end of the capacitor C20 is pushed up and the voltage of the first end of the capacitor C20 (i.e., the voltage of the node N20) becomes larger by a voltage vc20 than the initial value. The maximum value of the voltage vc20 is equal to the peak value VH of the pulse P3. Therefore, when the peak value VH of the pulse P3 and the power supply voltage vpp1 of the power supply terminal VPP1 are set to be equal to each other, the maximum value of the voltage vc20 of the node N20 becomes 2·vpp1. However, since the parasitic capacitance Cs20 exists between the node N20 and the ground electric potential GND, the voltage vc20 becomes 1.7·vpp1 to 1.9·vpp1, not 2·vpp1. In addition, although it is preferable in some embodiments to maximize the capacitance of the capacitor C20 in order to increase the voltage vc20 of the node N20, it may be desirable to keep it as small as possible in consideration of the degree of integration of the semiconductor integrated circuit. In the present disclosure, this capacitance is set to fall within a range of 4 pF to 16 pF.

In the present disclosure, the transistors, capacitors, power supply terminals and nodes constituting the bootstrap circuit 100 shown in FIG. 1 are referred to as follows. Specifically, the transistor Q10, the transistor Q20, the capacitor C10, the capacitor C20, the power supply terminal VPP1, the power supply terminal VPP2, the node N10 and the node N20 are referred to as a first transistor, a second transistor, a first capacitor, a second capacitor, a first power supply terminal, a second power supply terminal, a first node, and a second node, respectively. In addition, the pulse P2 and the pulse P3 are referred to as a first boost pulse and a second boost pulse.

The node N20 is coupled to the boost output terminal BOOT. Although it is shown in FIG. 1 that the node N20 is directly connected to the boost output terminal BOOT, a buffer or the like constituted by a transistor or different boost means may be interposed therebetween.

The sources S of the transistors Q10 and Q20 are connected in common to the power supply terminal VPP1. The power supply voltage vpp1 supplied to the power supply terminal VPP1 is, for example, 1.5V.

A series connection of a diode DR and a resistor RC is connected between the power supply terminal VPP2 and the boost output terminal BOOT. The power supply voltage vpp2 supplied to the power supply terminal VPP2 is appropriately set depending on a circuit configuration and a use state of the load LOAD coupled to the boost output terminal BOOT. For example, if the load LOAD is a memory cell of a semiconductor memory circuit device, the power supply voltage vpp2 is set to, for example, 5V when data is written in the memory cell. When data is read from the memory cell, the power supply voltage vpp2 is set to, for example, 1.5V which is equal to the power supply voltage vpp1.

The load LOAD is constituted by transistors Q30 and Q40. In the first embodiment, the transistor Q30 is a PMOS transistor and the transistor Q40 is an NMOS transistor. Gates G of the transistors Q30 and Q40 are connected in common to, for example, an address decoder (not shown).

The diode DR is provided to prevent a reverse current from flowing from the boost output terminal BOOT toward the power supply terminal VPP2 since the boost output voltage Vbo1, which is output to the boost output terminal BOOT when data is read from the memory cell constituting the load LOAD, exceeds the power supply voltage vpp2, 1.5V. The resistor RC is arranged to suppress a surge voltage applied from the outside of the bootstrap circuit 100 to the power supply terminal VPP2. A resistance value of the resistor ranges from a few ohms to several tens of ohms.

Second Embodiment

Figure 2:
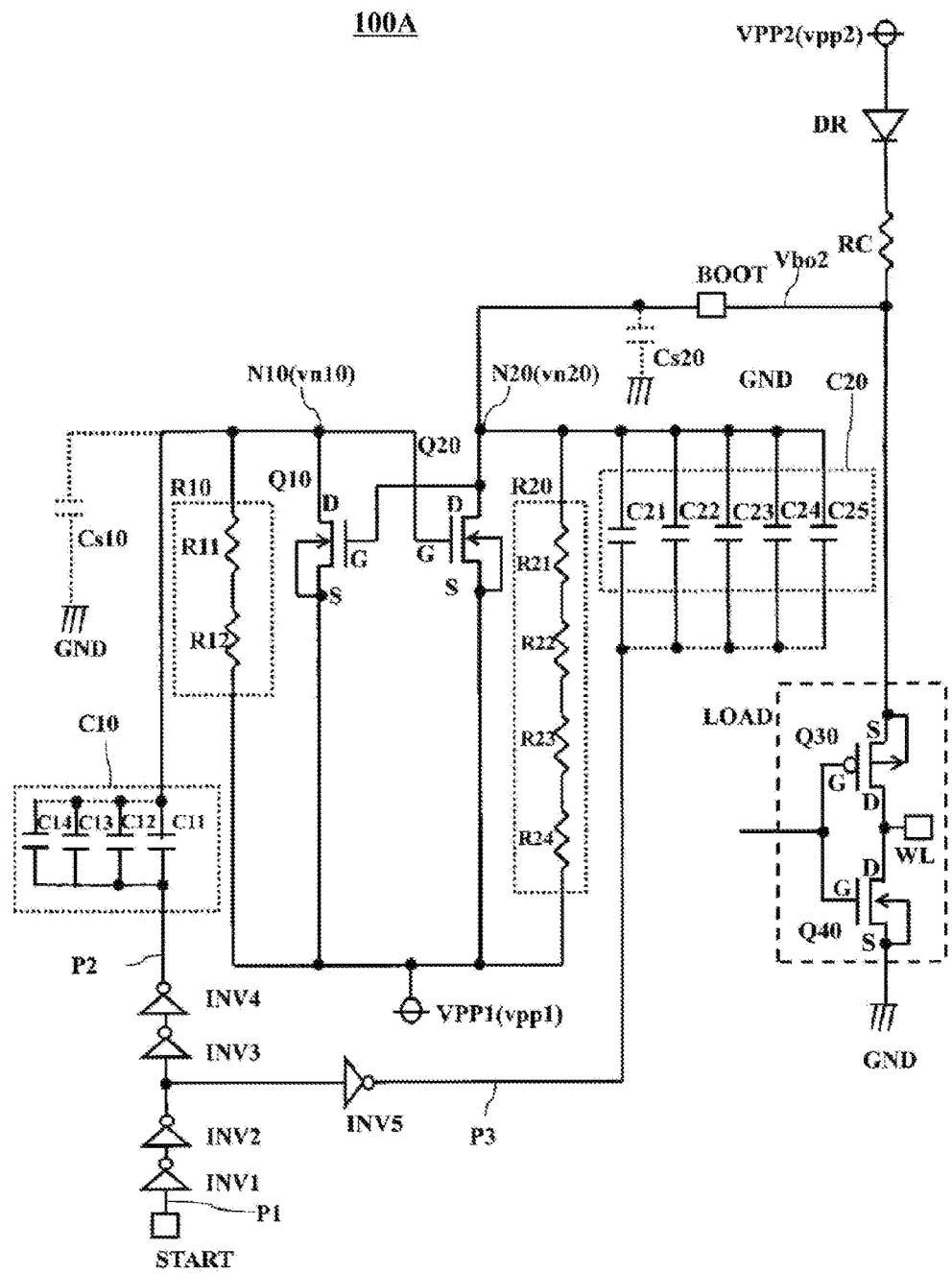
FIG. 2 shows a bootstrap circuit according to a second embodiment of the present disclosure.

FIG. 2 shows a second embodiment of the present disclosure. A bootstrap circuit 100A has the following differences from the bootstrap circuit 100 of the first embodiment shown in FIG. 1. First, a resistor R10 is coupled between the power supply terminal VPP1 and the node N10. Second, the capacitor C10 is constituted by a plurality of unit capacitors C11 to C14. Third, a resistor R20 is coupled between the power supply terminal VPP1 and the node N20. Fourth, the capacitor C20 is constituted by a plurality of unit capacitors C21 to C25.

The bootstrap circuit 100A has two boost means like the bootstrap circuit 100 shown in FIG. 1. The first boost means includes the transistor Q10, the capacitor C10 and the resistor R10. The transistor Q10, the capacitor C10 and the resistor R10 are referred to as a first transistor, a first capacitor and a first resistor, respectively, like the first embodiment. The capacitor C10 is provided to boost (step up) a voltage, like the first embodiment, and is constituted by the plurality of capacitors C11, C12, C13, and C14, and all capacitances of the capacitors are selected to be, for example, 0.5 pF. Since these capacitances are all the same, they may be referred to as unit capacitors. The capacitors C11 to C14 are connected or disconnected in at least one of a focused ion beam and a wiring process of a semiconductor integrated circuit device such that the overall capacitance of the capacitor C10 is selected to be a predetermined magnitude. If only the capacitor C11 is selected as the capacitor C10, its capacitance is 0.5 pF. If all of the capacitors C11 to C14 are selected as the capacitor C10, its capacitance is 2.0 pF.

The resistor R10 is formed of a plurality of resistors, for example, resistors R11 and R12. Like the connection of the capacitor C10, the resistors R11 and R12 are connected or short-circuited in at least one of a focused ion beam and a wiring process of a semiconductor integrated circuit device such that a predetermined magnitude is selected. The resistances of the resistors R11 and R12 are both, for example, 50 kΩ. Since these resistances are all the same, they may be referred to as unit resistors. If only the resistor R11 is selected as the resistor R10, its resistance is 50 kΩ. If both of the resistors R11 and R12 are selected as the resistor R10, its resistance is 100 kΩ. Although it is shown in FIG. 2 that the resistors R11 and R12 are connected in series, these resistors may be connected in parallel and the resistance thereof may be adjusted.

The second boost means includes the transistor Q20, the capacitor C20 and the resistor R20. The transistor Q20, the capacitor C20 and the resistor R20 are referred to as a second transistor, a second capacitor, and a second resistor. The capacitor C20 is formed of a plurality of capacitors, for example, the capacitors C21, C22, C23, C24, and C25. The capacitors C21 to C25 are connected or disconnected in at least one of a focused ion beam and a wiring process of a semiconductor integrated circuit device such that a predetermined magnitude is selected. All of the capacitors C21 to C25 may have the same capacitance, for example, 0.5 pF. Alternatively, only the capacitor C21 may have 4.0 pF and the capacitors C22 to C25 may have 0.5 pF. In any event, a plurality of unit capacitors which have the same capacitance are used. The overall capacitance of the capacitor C20 is appropriately set in combination of the capacitors C21 to C25, like the capacitor C10. The number of capacitors C21 to C25 included in the second boost means is larger than the number of capacitors C11 to C14 included in the first boost means, and the adjustable range is wider. The wider adjustable range used herein means a higher proportion of the settable maximum capacitance for the capacitance of the unit capacitor. Here, considering the adjustable range of the capacitor C10 cited above as the example, since the unit capacitance is 0.5 pF and the maximum capacitance is 2.0 pF, the adjustable range is four times. On the other hand, considering the capacitor 20 cited above as the example, an adjustable range of the capacitor C20 is 12 times since the unit capacitance is 0.5 pF and the maximum capacitance is 6.0 pF. Therefore, the adjustable range of the capacitor C20 constituting the second boost means is wider.

The resistor R20 constituting the second boost means is constituted by a plurality of resistors, for example, resistors R21 to R24. Since all of the resistances of the resistors R21 to R24 are, for example, 50 kΩ, these resistors may be referred to as unit resistors. Therefore, the resistance R20 is composed of an aggregate of unit resistors. Like the resistor R10, the resistors constituting the resistor R20 are connected in at least one of a focused ion beam and a wiring process of a semiconductor integrated circuit device such that the overall resistance of the resistor R20 is selected to be a predetermined size. If only the resistor R21 is selected as the resistor R20, its resistance is 50 kΩ. If all of the resistors R21 to R24 are selected as the resistor R20, its resistance is 200 kΩ. Although it is shown in FIG. 2 that the resistors R21 and R24 are connected in series, these unit resistors may be connected in parallel and the overall resistance thereof may be adjusted to a predetermined value.

An adjustable range of the resistor R20 constituting the second boost means is wider than an adjustable range of the resistor R10 constituting the first boost means. The wider adjustable range used herein means a higher proportion of the settable maximum resistance for the resistance of the unit resistor. Here, considering an adjustable range of the resistor R10 cited above as the example, since the unit resistance is 50 kΩ and the maximum resistance is 100 kΩ, the adjustable range is double. On the other hand, considering an adjustable range of the resistor R20 cited above as the example, an adjustable range of the resistor R20 is four times since the unit resistance is 50 kΩ and the maximum resistance is 200 kΩ. Therefore, the adjustable range of the resistor R20 constituting the second boost means is wider than that of the first boost means.

As one of the characteristics of the second embodiment of the present disclosure which are apparent from the above description, in comparison of the second boost means with the first boost means, the adjustable ranges of the capacitor C20 and the resistor R20 constituting the second boost means can be wider than those of the capacitor C10 and the resistor R10 constituting the first boost means. This is because, although the boost output voltage Vbo2 boosted in the bootstrap circuit 100A is output from the boost output terminal BOOT, the boost output terminal BOOT is connected to the first end of the resistor R20 as well as the first end of the capacitor C20 and is greatly involved in the magnitude and variation of the boost output voltage Vbo2. For this purpose, the adjustable range of the second boost means becomes wider. At any event, in the second embodiment, since the sizes of the resistors R10 and R20 and the capacitors C10 and C20 can be adjusted, the magnitude of the boost output voltage Vbo2 can be finely adjusted.

Figure 3:
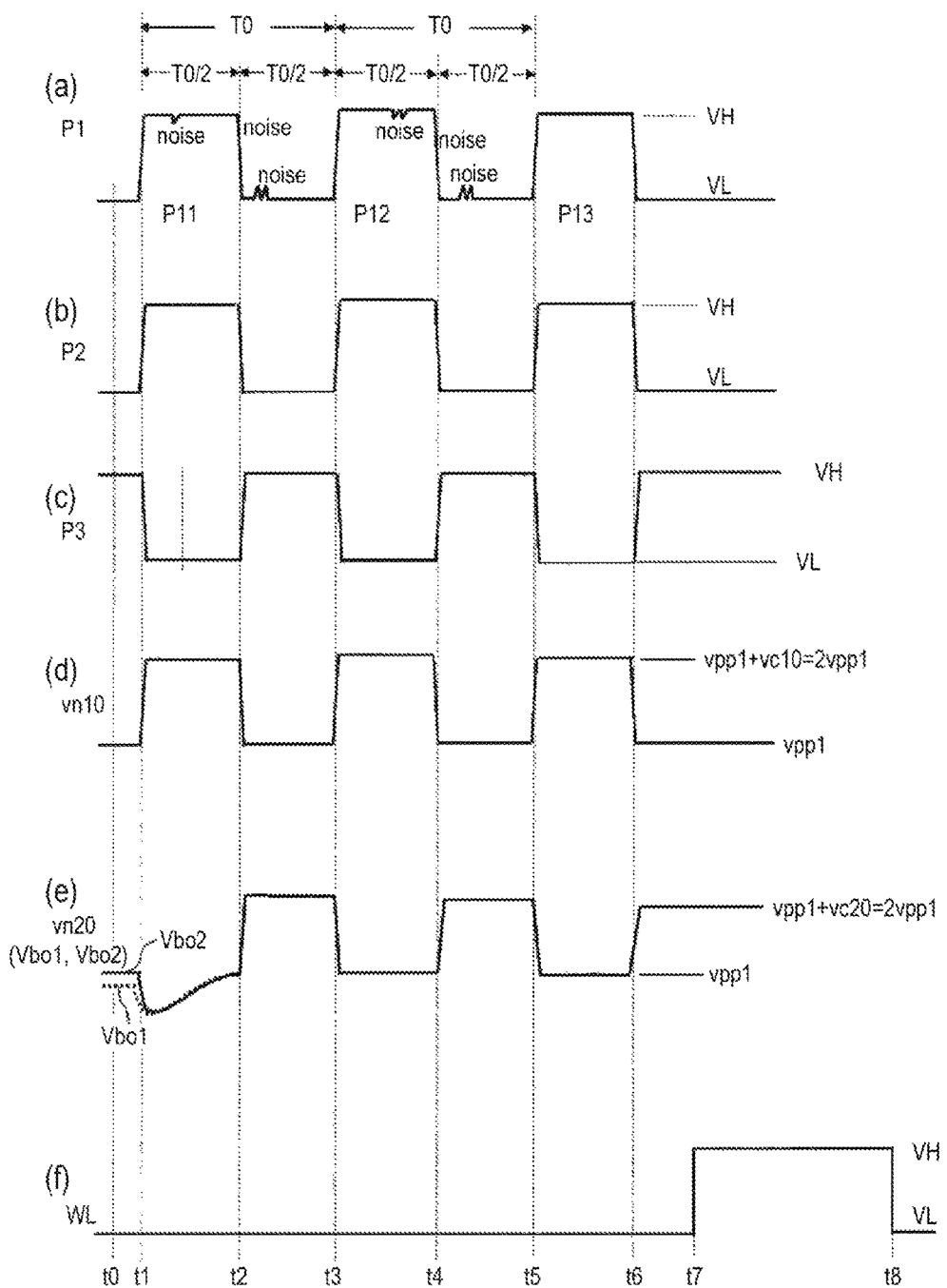
FIG. 3 is a timing chart of main nodes in FIGS. 1 and 2.

FIG. 3 shows signal waveforms of main nodes in FIGS. 1 and 2. Hereinafter, FIG. 3 will be described in conjunction with FIGS. 1 and 2.

A graph of (a) of FIG. 3 shows the pulse P1 applied to the boost pulse input terminal START. The pulse P1 includes a pulse P11, a pulse P12, and a pulse P13 in the generated order. The period T0 of the pulse P1 is set to, for example, 10 ns to 20 ns. In other words, the frequency f of the pulse P1 is set to, for example, 100 MHz to 50 MHz. The pulse width of the high level VH and the pulse width of the low level VL of the pulse P1 are ½ of the period T0, i.e., T0/2. In other words, the duty cycle of the pulse P1 is 50%. Thus, for example, if the period T0 is 20 ns, each of the pulse widths of the high level VH and the low level VL becomes 10 ns. The magnitude of the high level VH is, for example, 1.5V and the magnitude of the low level VL is, for example, 0V.

The pulse P1 has the low level VL at time t0. At time t0, while a voltage (for example, 1.5V) is applied to the power supply terminal VPP1 and the power supply terminal VPP2, the pulse P1 is not applied.

At time t1, the pulse P1 is applied and its level changes from the low level VL to the high level VH. The pulse P1 periodically alternates between the low level VL and the high level VH from time t2 to time t6 and maintains the low level VL after time t6.

A graph of (b) of FIG. 3 shows the pulse P2 output from the inverter INV4. The pulse P2 is obtained by removing a waveform distortion or a noise superimposed on the pulse P1 and shaping the pulse P1 by means of the inverters INV1 to INV4. The number of inverters INV1 to INV4 is selected so that the pulse P2 and the pulse P1 have the same polarity.

A graph of (c) of FIG. 3 shows the pulse P3 output from the inverter INV5. The pulse P3 is a pulse shaped from the pulse P1 having a waveform distortion or a noise superimposed on the pulse P1 by means of the inverters INV1, INV2, and INV5. The number of inverters INV1, INV2 and INV5 is selected so that the pulse P3 and the pulse P1 have the opposite polarity.

A graph of (d) of FIG. 3 shows the boost voltage vn10 generated at the node N10. The boost voltage vn10 corresponds to an addition of a push-up electric potential by the pulse P2 to the initial value of the node N10. The capacitor C10 is pushed up when the pulse P2 has the high level VH, and at that time, the electric potential is boosted, i.e., the voltage is stepped up. When the pulse P2 has the low level VL, since the electric potential of the capacitor C10 is not pushed up, the voltage of the node N10 is maintained at the initial value. Here, the initial value is substantially equal to the power supply voltage vpp1 supplied to the power supply terminal VPP1. The voltage vn10 of the node N10 is increased by the voltage vc10 of the push-up capacitor C10 in addition to the initial value in the high level periods of the pulse P2, that is, at times t1 to t2, t3 to t4, and t5 to t6. Ideally, the magnitude of the voltage vc10 is equal to the magnitude of the high level VH of the pulse P2. Therefore, here, when the magnitude of the power supply voltage vpp1 and the magnitude of the high level VH of the pulse P2 are both 1.5V, the maximum voltage of the node N10 is 3V (≅vpp1+vc10). However, the maximum voltage is reduced due to the parasitic capacitor Cs10 existing between the node N10 and the ground electric potential GND, etc. Results in real simulations show that the maximum voltage is reduced to 2.7V to 2.9V.

A graph of (e) of FIG. 3 shows the boost voltage vn20 output from the node N20. The magnitude of the boost voltage vn20 corresponds to an addition of a push-up electric potential by the pulse P3 to the initial value of the node N20. The capacitor C20 is pushed up when the pulse P3 has a high level VH, and at that time, the electric potential is boosted, i.e., the voltage is stepped up. When the pulse P3 has a low level VL, since the capacitor C20 is not pushed up, the voltage of the node N20 is maintained at the initial value. Here, the initial value is substantially equal to the power supply voltage vpp1 supplied to the power supply terminal VPP1. The voltage vn20 of the node N20 is increased by the voltage vc20 of the push-up capacitor C20 in addition to the initial value in the high level periods of the pulse P3, that is, at times t2 to t3 and t4 to t5. Ideally, the magnitude of the voltage vc20 is equal to the magnitude of the high level VH of the pulse P3. Therefore, when the magnitude of the power supply voltage vpp1 and the magnitude of the high level VH of the pulse P3 are both 1.5V, the maximum voltage of the node N20 is 3V (≅vpp1+vc20). However, the maximum voltage is reduced due to the parasitic capacitor Cs20 existing between the node N20 and the ground electric potential GND, etc. Results in real simulations show that the maximum voltage is reduced to 2.7V to 2.9V. The parasitic capacitor Cs20 existing between the node N20 and the ground electric potential GND is larger than the parasitic capacitor Cs10 existing between the node N10 and the ground electric potential GND. This is because the number of circuit elements connected to the node N20 is larger than the number of circuit elements connected to the node N10, thereby increasing the overall capacitance. Therefore, in the present disclosure, the capacitance of the capacitor C20 is set to be 2 to 6 times as large as the capacitance of the capacitor C10.

Since the boost voltage vn20 of the node N20 is output to the boost output terminal BOOT, it is more important than the boost voltage vn10 of the node N10. However, it is found that there is a little difference in value at time t0 between the bootstrap circuit 100 shown in FIG. 1 and the bootstrap circuit 100A shown in FIG. 2. In other words, in the bootstrap circuit 100 shown in FIG. 1, the boost voltage Vbo1 output to the node N20 is indefinite. Simulation results show that the voltage of the node N20 of the bootstrap circuit 100 is lower than the voltage vn20 of the node N20 of the bootstrap circuit 100A shown in FIG. 2. This is because a voltage sufficient to turn on the transistor Q20 is not applied. On the other hand, in the bootstrap circuit 100A shown in FIG. 2, the power supply voltage vpp1 is applied by the resistor R10 to the gate G of the transistor Q20, i.e., the node N10 and is applied by the resistor R20 to the gate G of the transistor Q10, i.e., the node N20, and thus the voltage at time t0, i.e., the initial value, is fixed to substantially the same magnitude as the power supply voltage vpp1.

Although the boost voltage vn20 of the node N20 may not be sufficiently output in the period of times t1 to t2, i.e., the period of the pulse P11, it is found that the bootstrap circuit 100A and the bootstrap circuit 100 have substantially the same characteristics after time t2, i.e., the period of the pulses P12 and P13. In other words, although a sufficient boost effect cannot be obtained by only one pulse P1 (the pulse P11), as the number of the pulses P1 is increased to two or three (the pulse P12 or the pulse P13), it is confirmed that a sufficient boost effect can be obtained, serving a sufficient function as a bootstrap circuit.

A graph of (f) of FIG. 3 shows a word line signal WL applied to the load LOAD. The word line signal WL is allowed to be supplied after time t7 which is a timing at which the boost voltage output to the boost output terminal BOOT, i.e., the node N20, is sufficiently boosted. Time t7 is appropriately set based on the period T0 of the pulse P1 and the number of boost pulses (corresponding to P11, P12 and P13 in the graph of (a) of FIG. 3). The word line signal WL is a signal having a low level VLWL and a high level VHWL.

Third Embodiment

Figure 4:
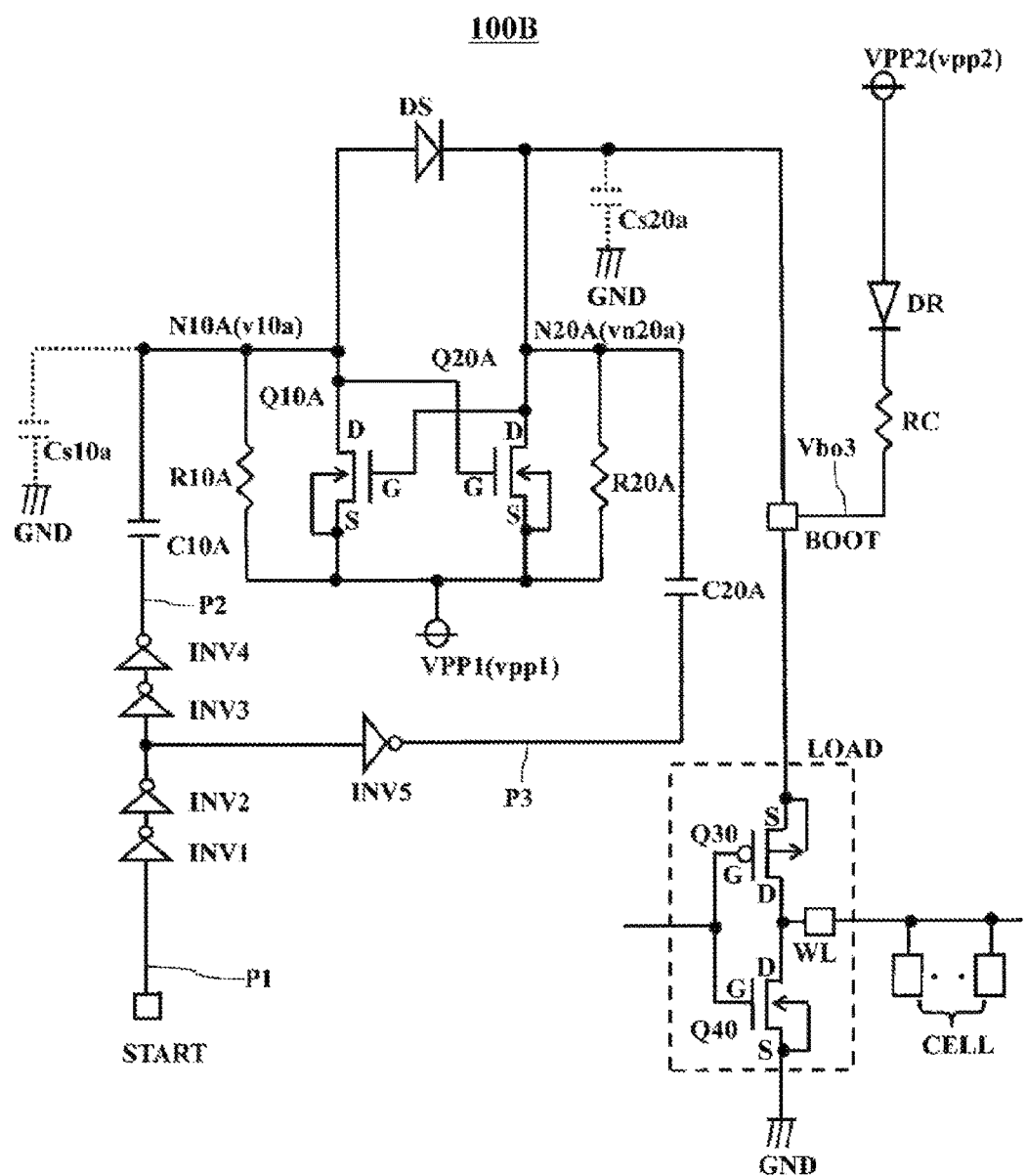
FIG. 4 shows a bootstrap circuit according to a third embodiment of the present disclosure.

FIG. 4 shows a bootstrap circuit 100B according to a third embodiment of the present disclosure. The bootstrap circuit 100B has only one substantial difference from the bootstrap circuit 100A shown in FIG. 2. The difference is that, in the bootstrap circuit 100B, a diode DS is connected between a node N10A and a node N20A. Further, in the bootstrap circuit 100B, although a single resistor R10A and a single resistor R20A are connected between the node N10A and the power supply terminal VPP1 and between the node N20A and the power supply terminal VPP1, respectively, it may be considered that these resistors are substantially the same as the resistors R10 and R20 shown in FIG. 2.

The resistors R10A and R20A have the same function as the resistors R10 and R20 in the second embodiment shown in FIG. 2. That is, the resistors R10A and R20A are provided to fix an initial value of the nodes N10A and N20A at a predetermined value. The initial value used herein refers to a level of an electric potential when the pulse P1 is not supplied to the boost pulse input terminal START although the power supply voltage vpp1 and the power supply voltage vpp2 are supplied to the power supply terminal VPP1 and the power supply terminal VPP2, respectively. When the pulse P1 is applied to the boost pulse input terminal START and has a low level VL, a transistor Q10A is turned on and a transistor Q20A is turned off. When the pulse P1 has a high level VH, the transistor Q20A is turned on and the transistor Q10A is turned off.

In the bootstrap circuit 100B, since the diode DS is forwardly biased in a period where an electric potential v10a of the node N10A is higher than an electric potential v20a of the node N20A, that is, a period where the pulse P2 has a high level VH and the pulse P3 has a low level, the electric potential v20a is lower by a forward voltage Vds of the diode DS than the electric potential v10a.

In addition, since the diode DS is backwardly biased in a period where the electric potential v10a of the node N10A is lower than the electric potential v20a of the node N20A, that is, a period where the pulse P2 has a low level VL and the pulse P3 has a high level, the electric potential v20a is set to be separated from the electric potential v10a.

The bootstrap circuit 100B shown in FIG. 4 is characterized in that the diode DS is connected between the node N10A and the node N20A. The diode DS is connected in such a manner that its anode is connected to the node N10A and its cathode is connected to the node N20A. The reason for this is to increase the electric potential of the node N20 by supplying charges from the first node, i.e., the node N10A, to the second node, i.e., the node N20A.

Fourth Embodiment

Figure 5:
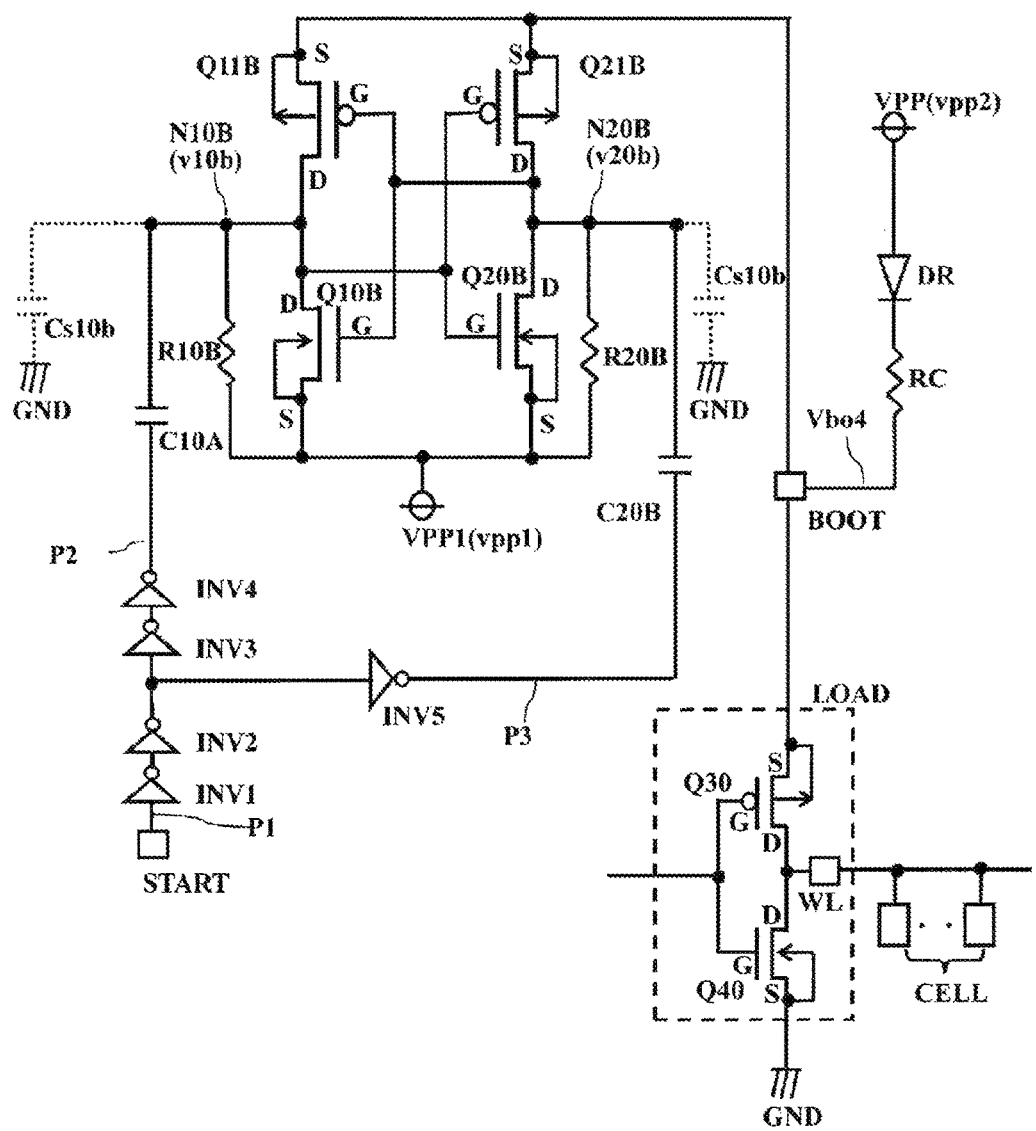
FIG. 5 shows a bootstrap circuit according to a fourth embodiment of the present disclosure.

FIG. 5 shows a bootstrap circuit 100C according to a fourth embodiment of the present disclosure. The bootstrap circuit 100C employs a flip-flop, like the above-described bootstrap circuits 100, 100A, and 100B. Specifically, a drain D of a transistor Q10B is connected to a gate G of a transistor Q20B and a drain D of the transistor Q20B is connected to a gate G of the transistor Q10B. A common connection point of the drain D of the transistor Q10B and the gate G of the transistor Q20B is denoted by a node N10B and a common connection point of the drain D of the transistor Q20B and the gate G of the transistor Q10B is denoted by a node N20B. The node N10B and the node N20B are referred to as a first node and a second node, respectively.

In the meantime, the bootstrap circuit 100C has the following two substantial differences from the bootstrap circuit 100B shown in FIG. 2. The first difference is to connect a transistor Q11B between the first node, i.e., the node N10B, and the boost output terminal BOOT. The second difference is to connect a transistor Q21B between the second node, i.e., the node N20B, and the boost output terminal BOOT.

The bootstrap circuit 100C is simply characterized in that an electric potential of the second node, i.e., the node N20B, can be transmitted to the boost output terminal BOOT via the transistor Q21B and an electric potential of the first node, i.e., the node N10B, can be transmitted to the boost output terminal BOOT via the transistor Q11B. In other words, since charges are supplied from the first boost means and the second boost means to the boost output terminal BOOT, boost efficiency can be increased.

In addition, in the bootstrap circuit 100C, in order to output the boost voltage v20b or the boost voltage v10b generated at the node N20B or the node N10B to the boost output terminal BOOT via the transistor Q21B or the transistor Q11B, a boost voltage loss is generated which causes a boost output voltage Vbo4 output to the boost output terminal BOOT to be decreased by 0.1V to 0.2V. However, this loss can be covered by adjustment of the size of a capacitor C20B.

Sources S of the transistor Q10B and the transistor Q20B are connected in common to the power supply terminal VPP1 as the first power supply terminal and the power supply voltage vpp1 supplied to the power supply terminal VPP1 is selected as, for example, 1.5V.

The transistors Q10B and Q20B are both constituted by an NMOS transistor which is referred to as a first conductivity type in the present disclosure. The transistors Q10B and Q20B are both constituted by a PMOS transistor which is referred to as a second conductivity type in the present disclosure. Therefore, the first conductivity type and the second conductivity type are opposite conductivity types.

A source S and a drain D of the transistor Q11B are connected to the boost output terminal BOOT and the node N10B, respectively. A source S and a drain D of the transistor Q21B are connected to the boost output terminal BOOT and the node N20B, respectively. The transistors Q11B and Q21B are both constituted by a PMOS transistor of the second conductivity type.

Figure 6:
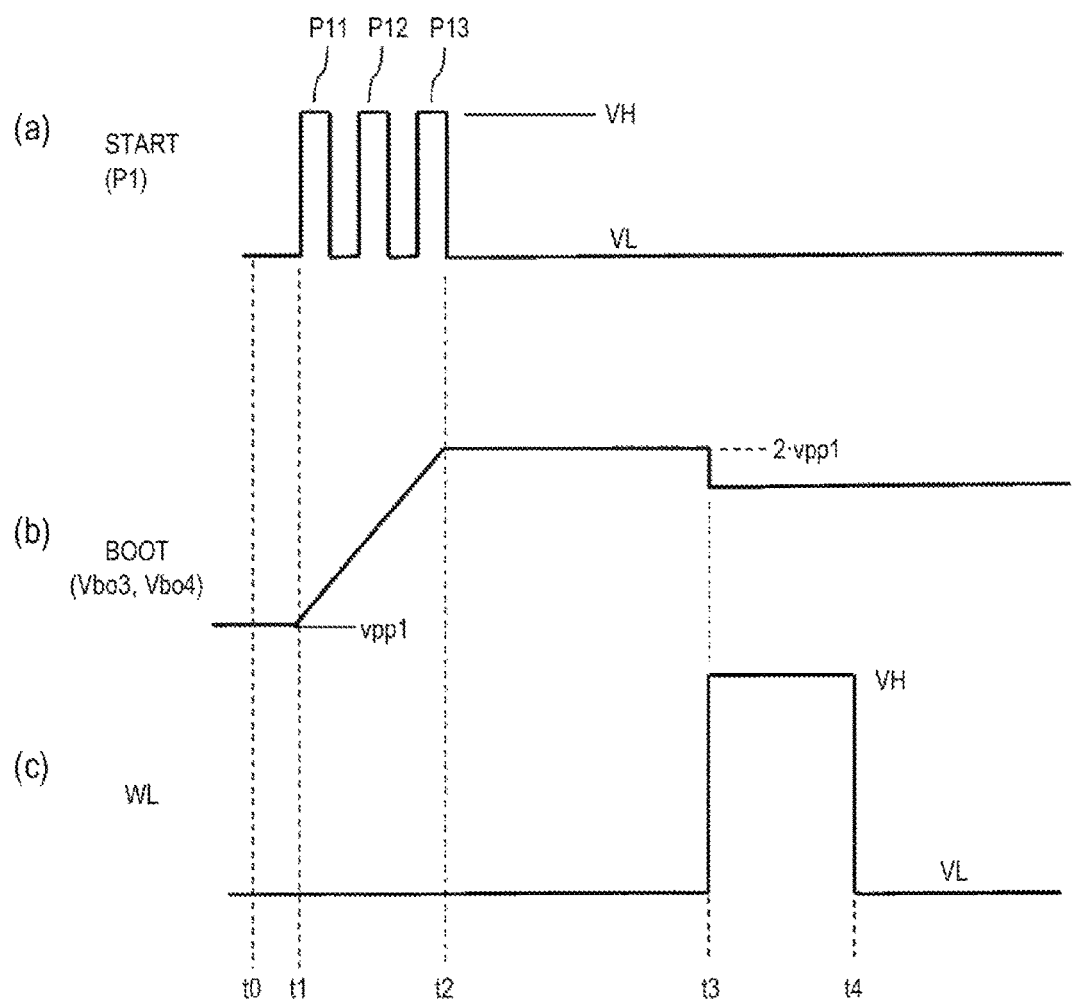
FIG. 6 is a timing chart of main nodes in FIGS. 4 and 5.

FIG. 6 is a timing chart of main nodes of the bootstrap circuits 100B and 100C shown in FIGS. 4 and 5, respectively. A graph of (a) of FIG. 6 shows the pulse P1 applied to the boost pulse input terminal START. The graph of (a) of FIG. 6 shows a state where the pulse P1 has a low level VL at time t0, the first pulse P11 is applied at time t1, and the second pulse P12 and the third pulse P13 are subsequently applied up to time t2.

A graph of (b) of FIG. 6 shows change of the boost output voltages Vbo3 and Vbo4 output to the boost output terminal BOOT. The boost output voltage Vbo3 and Vbo4 are substantially equal to the power supply voltage vpp1 at time t0 at which the pulse P1 is not applied, and, however, are maintained at the magnitude of 2·vpp1, which is about twice as large as the power supply voltage vpp1, after time t2 by which the boost output voltages Vbo3 and Vbo4 are gradually increased in a period of times t1 to t2 during which the pulse P1 is supplied. Precisely, this is the case where the high level VH of the pulse P1 is the same as the power supply voltage vpp1. For example, if the power supply voltage vpp1 is 1.5V and the high level VH is 1.5V, the boost output voltages Vbo3 and Vbo4 are substantially 3V. However, in actuality, since a loss occurs in the boost voltage due to the magnitude of the capacitor C20B and a parasitic capacitor Cs20b, the boost output voltages Vbo3 and Vbo4 fall within a range of 2.7V to 2.9V.

Fifth Embodiment

Figure 7:
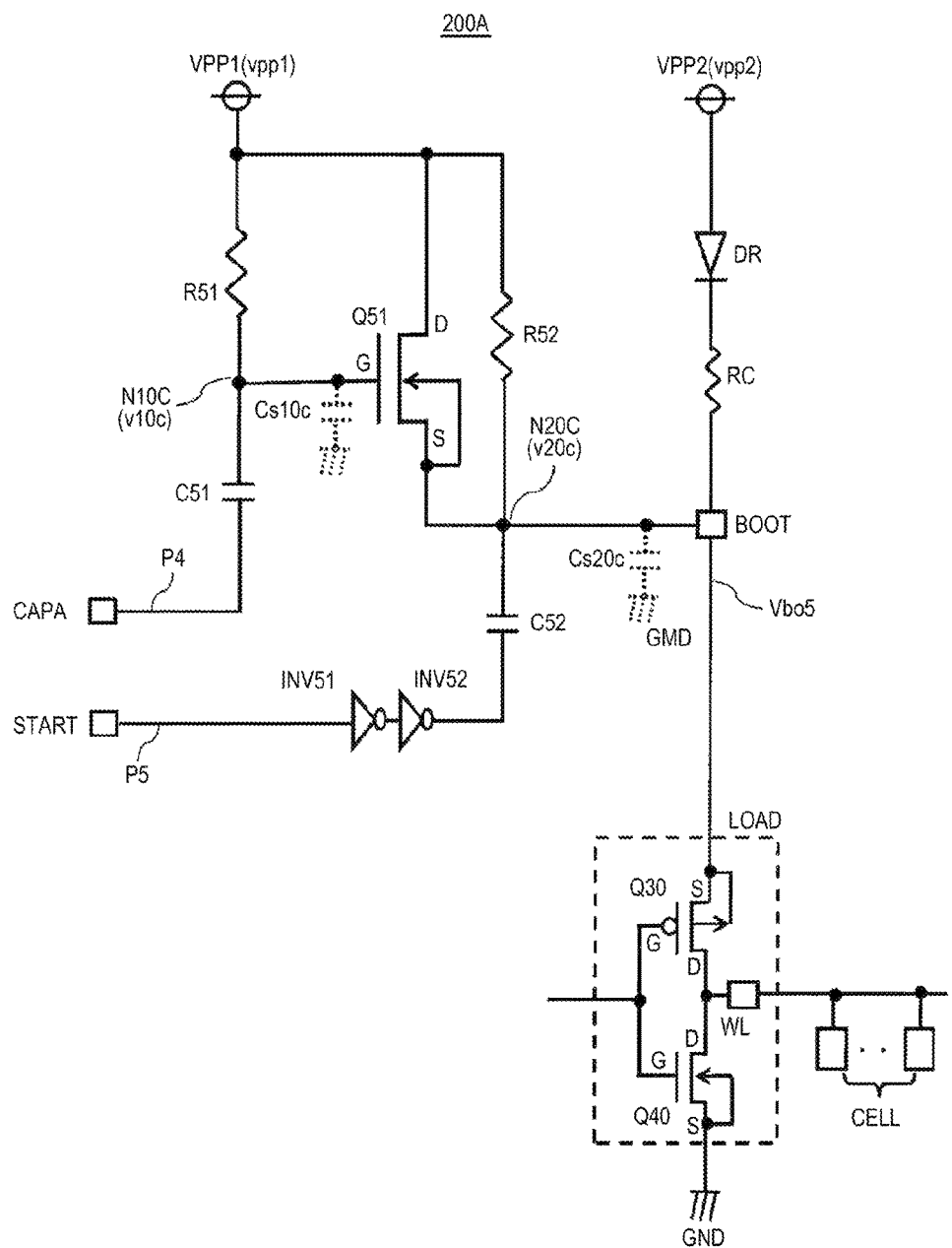
FIG. 7 shows a bootstrap circuit according to a fifth embodiment of the present disclosure.

FIG. 7 shows a bootstrap circuit 200A according to a fifth embodiment of the present disclosure. The bootstrap circuit 200A is constituted by the first boost means and the second boost means, like the above-described first to fourth embodiments. However, the bootstrap circuit 200A is different from the above-described first to fourth embodiments in that no flip-flop is employed and two boost pulses are used instead of a single boost pulse. The bootstrap circuit 200A is characterized by being constituted by a relatively small number of circuit elements.

The first boost means in the bootstrap circuit 200A includes a resistor R51 and a capacitor C51. A first end of the resistor R51 is connected to the power supply terminal VPP1 and a second end of the resistor R51 is connected to a node N10C. A first end of the capacitor C51 is connected to the node N10C and a second end of the capacitor C51 is connected to a pulse input terminal CAPA. A pulse P4 is supplied to the pulse input terminal CAPA. When the pulse P4 has a high level VH, an electric potential of the capacitor C51 is pushed up and an voltage $v10c$ of the node N10C is maintained at $v10c=(vpp1+vc51)$. The electric potential of the capacitor C51 is pushed up by the pulse P4, and here, the voltage $vc51$ is a so-called boost voltage. Ideally, the voltage $vc51$ is equal to the high level VH of the pulse P4. However, since a parasitic capacitor $Cs10c$ exists between the N10C and the ground electric potential GND, the boosted voltage is 0.8 to 0.9 times as large as the maximum value of the boost pulse P4. In order to suppress the decrease in the boosted voltage, the capacitance of the capacitor C51 may be selected to be larger.

The second boost means constituting the bootstrap circuit 200A includes a resistor R52, a capacitor C52 and inverters INV51 and INV52. A first end of the resistor R52 is connected to the power supply terminal VPP1 and a second end of the resistor R52 is connected to a node N20C. A first end of the capacitor C52 is connected to the node N20C, a second end of the capacitor C52 is connected to an output of the inverter INV52, an input of the inverter INV52 is connected to an output of the inverter INV51, and an input of the inverter INV51 is connected to the boost pulse input terminal START. A boost pulse P5 is applied to the boost pulse input terminal START.

The inverters INV51 and INV52 are provided to shape a waveform of the boost pulse P5. The inverters INV51 and INV52 may be constituted by a CMOS transistor.

When the pulse P5 has a high level VH, an electric potential of the capacitor C52 is pushed up and the node N20C is boosted. That is, the electric potential of the node N20C is stepped up by a voltage equal to or above the power supply voltage vpp1 supplied to the power supply terminal VPP1. When the pulse P5 has a low level, the voltage $v20c$ of the node N20C is maintained at the magnitude which is approximately equal to that of a voltage supplied from the power supply terminal VPP1 via the resistor R52, i.e., the power supply voltage vpp1.

The transistor Q51 has a role of a coupling means for coupling the first boost means and the second boost means. The transistor Q51 is constituted by an NMOS transistor. In order to turn on the transistor Q51, a voltage of the gate G has to be higher by at least a threshold voltage Vt than a voltage of the source S. Since the source of the transistor Q51 is coupled to the boost output terminal BOOT and further a voltage higher than the power supply voltage vpp1 supplied to the power supply terminal VPP1 is output from the boost output terminal BOOT, the voltage of the gate G has to be equal to or higher than (vpp1+Vt). A circuit means for this is the resistor R51 and the capacitor C51 constituting the first boost means. Therefore, an NMOS transistor having a low threshold voltage Vt may be employed to turn on the transistor Q51. However, since providing the NMOS transistor having the small threshold voltage Vt is accompanied by difficulties, a depletion type NMOS transistor may be employed in some embodiments.

The diode DR, the resistor RC and the load LOAD are coupled to the bootstrap circuit 200A via the boost output terminal BOOT, like the earlier-described bootstrap circuits. These circuit elements are the same as those described so far and, therefore, explanation of which will not be repeated.

FIG. 8 is a timing chart of main nodes of the bootstrap circuit 200A shown in FIG. 7. A graph of (a) of FIG. 8 shows the boost pulse P4 applied to the boost pulse input terminal CAPA. Time t0 shows a state where the pulse P4 is not yet applied although the power supply voltages vpp1 and vpp2 are supplied to the power supply terminals VPP1 and VPP2, respectively.

At time t1, the pulse P4 changes from a low level VL to a high level VH. The condition of the high level VH continues until time t2. The pulse P4 maintains the low level VL after time t2.

A graph of (b) of FIG. 8 shows the pulse P5 applied to the boost pulse input terminal START. The pulse P5 maintains the low level VL from time t1 to time t3 and maintains the high level VH after time t3. In order to avoid the pulse P5 and the pulse P4 from having the high level VH at the same time, time t3 at which the pulse P5 changes from the low level VL to the high level VH is set to be after time t2 at which the pulse P4 maintains at the high level VH.

A graph of (c) of FIG. 8 shows the voltage $v10c$ of the node N10C. The change of the voltage $v10c$ follows the behavior of the pulse P4. That is, although the voltage $v10c$ at time t0 is substantially equal to the power supply voltage vpp1, since the electric potential of the capacitor C51 is pushed up by the pulse P4 in the period from time t1 to t2, the voltage $v10c$ becomes $v10c=(vpp1+vc51)$. Here, the capacitor C51 is pushed up, and $vc51$ is a magnitude of a so-called boost voltage. Ideally, the magnitude of the boost voltage $vc51$ is equal to the high level VH of the pulse P4. However, since the parasitic capacitor $Cs10c$ exists between the node N10C and the ground electric potential GND, the magnitude of the boost voltage $vc51$ is smaller than VH, i.e. $vc51<VH$. After time t2, the voltage $v10c$ becomes substantially equal to the power supply voltage vpp1 of the power supply terminal VPP1.

A graph of (d) of FIG. 8 shows the voltage $v20c$ of the node N20C, which is also a boost output voltage Vbo5 of the boost output terminal BOOT. The boost output voltage Vbo5 is shown as a voltage VbSL at time t0. The voltage Vbo5 is determined by a voltage applied to the drain D of the transistor Q51, i.e., the power supply voltage vpp1 supplied to the power supply terminal VPP1, a voltage applied to the gate G, i.e., the boost voltage $v10c$ of the node N10C, and the threshold voltage Vt of the transistor Q51. In this embodiment, the voltage VbSL is, for example, 1.1V to 1.2V.

In the graph of (d) of FIG. 8, upon reaching time t1, the boost output voltage Vbo5 begins to gradually increase. When the voltage of the node N20C becomes (vpp1+vc51) at time t1, the turn-on state of the transistor Q51 becomes longer, the capacitor C52 is charged by a current flowing from the drain D toward the source S, and the boost voltage Vbo5 of the boost output terminal BOOT gradually increases toward time t2.

In the graph of (d) of FIG. 8, although the voltage $v10c$ of the node N10C changes from (vpp1+vc51) to vpp1 at time t2, the boost output voltage Vbo5 of the boost output terminal BOOT maintains the voltage Vb5N in a short period until time t3. This is because it takes a predetermined time until charges stored in the node N20C are completed to be discharged. When the predetermined time is short, the boost output voltage Vbo5 is maintained as it is.

In the graph of (d) of FIG. 8, upon reaching time t3, the pulse P5 pushes up the electric potential of the capacitor C52 from the boost pulse input terminal START via the inverters INV51 and INV52. Accordingly, the voltage v20c of the node N20C is at once boosted from the voltage Vb5N to a voltage Vb5H. Here, the magnitude of the boosted voltage (Vb5H–Vb5N) is substantially equal to the high level VH of the pulse P5.

In the graph of (d) of FIG. 8, upon reaching time t4, the boost output voltage Vbo5 of the boost output terminal BOOT decreases from the voltage Vb5H to a voltage Vb5M. This is because a signal is applied to a word line WL shown in a graph of (e) of FIG. 8 upon reaching time t4. In a period from time t4 to time t5, when the load LOAD is turned on, as each cell contained in the load LOAD is turned on, the boost output voltage Vbo5 supplied from the boost output terminal BOOT having a finite output resistance component decreases.

A level of decrease in the output voltage Vbo5 varies little by little depending on the number of columns of memory cells CELL coupled to the load LOAD. In the embodiment of the present disclosure, as a result of comparison between a 32-column word line driver and a 128-column word line driver, each of which serves as the load LOAD, it is found that there is a difference of less than about 0.1V between both. For example, if the boost output voltage Vbo5 is 2.80V for the 32-column word line driver, the boost output voltage Vbo5 is 2.72V for the 128-column word line driver, finding that there is a difference of 80 mV between both.

The graph of (e) of FIG. 8 shows the word line signal WL output from the load LOAD, as described a little earlier. A generation timing of the word line signal WL is determined in view of the generation timings of the pulses P4 and P5 and the behavior of the boost output voltage v20c of the node N20C.

Sixth Embodiment

FIG. 9 shows a bootstrap circuit 200B according to a sixth embodiment of the present disclosure. The bootstrap circuit 200B is in common with the above-described first to fifth embodiments in that it is constituted by the first boost means and the second boost means. However, the bootstrap circuit 200B is different from the above-described first to fourth embodiments in that no flip-flop is employed. In addition, the bootstrap circuit 200B is different from the above-described first to fifth embodiments in that three pulses are used instead of a single boost pulse and two pulses. The bootstrap circuit 200B has substantially the same configuration as the bootstrap circuit 200A of the fifth embodiment except two differences therebetween. The first difference is that the bootstrap circuit 200B employs the three pulses whereas the bootstrap circuit 200A employs the two pulses to generate the boost voltage. The second difference is that the bootstrap circuit 200B employs two transistors and one resistor whereas the bootstrap circuit 200A employs one transistor and two resistors.

The bootstrap circuit 200B shown in FIG. 9 includes a power supply terminal VPP1 as a first power supply terminal, a node N10D as a first node, a node N20D as a second node, a pulse input terminal CAPA, a boost pulse input terminal START and a pulse input terminal PCH. The first boost means includes a transistor Q61 and a capacitor C61.

A source S of the transistor Q61 is connected to the power supply terminal VPP1 and a drain D of the transistor Q61 is connected to the node N10D. A first end of the capacitor C61 is connected to the node N10D and a second end of the capacitor C61 is connected to the pulse input terminal CAPA. The pulse P4 is supplied to the pulse input terminal CAPA from the outside. When the pulse P4 has a high level VH, an electric potential of the capacitor C61 is pushed up and a voltage v10d of the node N10D is maintained at v10d=(vpp1+vc61). The capacitor C61 is pushed up by the pulse P4, and here, the voltage vc61 is a so-called boost voltage. Ideally, the voltage vc61 is equal to the high level VH of the pulse P4. However, since a parasitic capacitor Cs10d exists between the node N10D and the ground electric potential GND, the boosted voltage is 0.8 to 0.9 times as large as the maximum value of the boost pulse P4. In order to suppress the decrease in the boosted voltage, the capacitance of the capacitor C61 may be selected to be larger.

The second boost means constituting the bootstrap circuit 200B includes a resistor R62, a capacitor C62 and inverters INV61 and INV62. A first end of the resistor R62 is connected to the power supply terminal VPP1 and a second end of the resistor R62 is connected to the node N20D. A first end of the capacitor C62 is connected to the node N20D, a second end of the capacitor C62 is connected to an output of the inverter INV62, an input of the inverter INV62 is connected to an output of the inverter INV61, and an input of the inverter INV61 is connected to the boost pulse input terminal START. The pulse P5 is applied to the boost pulse input terminal START from the outside.

The inverters INV61 and INV62 are provided to shape a waveform of the pulse P5. The inverters INV61 and INV62 may be constituted by a CMOS transistor.

When the pulse P5 has a high level, an electric potential of the capacitor C62 is pushed up and the node N20D is boosted. That is, the voltage of the node N20D is stepped up by a voltage equal to or above the power supply voltage vpp1 supplied to the power supply terminal VPP1. When the pulse P5 has a low level VL, the voltage v20d of the node N20D is maintained approximately equal to a voltage supplied from the power supply terminal VPP1 via the resistor R62, i.e., the power supply voltage vpp1.

The transistor Q62 has a role of a coupling means for coupling the first boost means and the second boost means. The transistor Q62 is constituted by an NMOS transistor. In order to turn on the transistor Q62, a voltage of the gate G has to be higher by at least a threshold voltage Vt than a voltage of the source S. Since the source S of the transistor Q62 is coupled to the boost output terminal BOOT and further a voltage higher than the power supply voltage vpp1 supplied to the power supply terminal VPP1 is output from the boost output terminal BOOT, the voltage of the gate G of the transistor Q62 has to be equal to or higher than (vpp1+Vt). A circuit means for this is the transistor Q61 and the capacitor C61 constituting the first boost means. Therefore, an NMOS transistor having a low threshold voltage Vt may be employed to turn on the transistor Q62. However, since providing the NMOS transistor having the small threshold voltage. Vt is accompanied by difficulties, a depletion type NMOS transistor may be employed in some embodiments.

The resistor R62 is connected between the power supply terminal VPP1 and the node N20D. The resistor R62 is provided to maintain the initial voltage of the node N20D at the power supply voltage vpp1 of the power supply terminal VPP1. The resistance of the resistor R62 is preferably small to rapidly secure the initial voltage of the node N20D. However, when the resistance of the resistor R62 is set to be small, charges stored in the node N20D are quickly discharged and the boosted voltage is decreased in a short time. In one embodiment of the present disclosure, it is found that a desirable boost effect can be achieved if the resistance of R62 is set to 200 KΩ when the capacitance of the capacitor C61=2 pF, the capacitance of the capacitor C62=8 pF and the power supply voltage vpp1=vpp2=1.5V.

The diode DR, the resistor RC and the load LOAD are coupled to the bootstrap circuit 200B via the boost output terminal BOOT, like the earlier-described bootstrap circuits. These circuit elements are the same as those described so far and, therefore, explanation of which will not be repeated.

FIG. 10 is a timing chart of main nodes of the bootstrap circuit 200B according to the sixth embodiment shown in FIG. 9. The timing chart shown in FIG. 10 may use that of the fifth embodiment shown in FIG. 8. FIG. 10 shows the various signal waveforms shown in FIG. 8 and the pulse P6 applied to the pulse input terminal PCH.

A graph of (a) of FIG. 10 shows the pulse P6 applied to the pulse input terminal PCH, i.e., the gate G of the transistor Q61. The transistor Q61 is turned on/off by the pulse P6. The pulse P6 has a low level VL at time t0, changes to a high level VH at time t1, and continues the high level VH until time t7. The transistor Q61 is turned off during the period of the high level VH and is turned on during the period of the low level VL. The pulse P6 maintains the high level VH until time t7 at which a pulse applied to the word line WL is applied.

A graph of (b) of FIG. 10 shows the pulse P4 input to the pulse input terminal CAPA. The pulse P4 has the low level VL at an initial state, i.e., time t0. The pulse P4 changes from the low level VL to the high level VH at time t2 which is a little later than time t1 at which the pulse P6 changes from the low level VL to the high level VH, and continues the condition of the high level VH until time t3. The pulse P4 maintains the low level VL after time t3.

A graph of (c) of FIG. 10 shows the pulse P5 applied to the boost pulse input terminal START. The pulse P5 maintains the low level VL from time t1 to time t4 and maintains the high level VH after time t4. In order to avoid the pulse P5 and the pulse P4 from having the high level VH at the same time, the pulse P5 is maintained at the low level VL at time t3 at which the pulse P4 change from the high level VH to the low level VL, and the high level VH of the pulse P5 is set at time t4 after time t3.

A graph of (d) of FIG. 10 shows the voltage v10d of the node N10D. The change of the voltage v10d follows the behavior of the pulse P4. That is, although the voltage v10d at time t0 is nearly equal to the power supply voltage vpp1, since the voltage of the capacitor C61 is pushed up by the pulse P4 in the period from time t0 to t2, the voltage v10d becomes v10d (vpp1+vc61). The capacitor C61 which is pushed up, and here, the voltage vc61 is a so-called the magnitude of the boost voltage. Ideally, the magnitude of the boost voltage vc61 is equal to the high level VH of the pulse P4. However, since the parasitic capacitor Cs10d exists between the node N10D and the ground electric potential GND, the magnitude of the boost voltage vc61 is smaller than VH (i.e. vc61<VH). After time t3, the voltage v10d becomes substantially equal to the power supply voltage vpp1 of the power supply terminal VPP1.

A graph of (e) of FIG. 10 shows the voltage of the node N20D, which is also the boost output voltage Vbo6 of the boost output terminal BOOT. The boost output voltage Vbo6 is shown as a voltage Vb6L at time t0 and time t1. The voltage Vbo6 is determined by a voltage applied to the drain D of the transistor Q61, i.e., the power supply voltage vpp1 supplied to the power supply terminal VPP1, a voltage applied to the gate G, i.e., the boost voltage v10d of the node N10D, and the threshold voltage Vt of the transistor Q62. In this embodiment, the voltage Vb6L is, for example, 1.1V to 1.2V.

In the graph of (e) of FIG. 10, upon reaching time t2, the boost voltage Vbo6 begins to gradually increase. When the voltage of the node N10D becomes (vpp1+vc61) at time t2, the turn-on state of the transistor Q62 becomes longer, the capacitor C62 is charged by a current flowing from the drain D toward the source S, and the boost voltage Vbo6 of the boost output terminal BOOT gradually increases toward time t3.

In the graph of (e) of FIG. 10, although the voltage v10d of the node N10D change from (vpp1+vc61) to vpp1 at time t3, the boost output voltage Vbo6 of the boost output terminal BOOT maintains the voltage Vb6N in a short period until time t4. This is because it takes a predetermined amount of time until charges stored in the node N20D are completed to be discharged. When the predetermined time is short, the boost output voltage Vbo6 is maintained as it is.

In the graph of (e) of FIG. 10, upon reaching time t4, the pulse P5 pushes up the electric potential of the capacitor C62 from the boost pulse input terminal START via the inverters INV61 and INV62. At this time, the voltage v20d of the node N20D is at once boosted from the voltage Vb6N to a voltage Vb6H. Here, the magnitude of the boosted voltage (Vb6H−Vb6N) is substantially equal to the high level VH of the pulse P5.

In the graph of (e) of FIG. 10, upon reaching time t5, the boost output voltage Vbo6 of the boost output terminal BOOT decreases a little. This is because a signal is applied to a word line WL shown in a graph of (f) of FIG. 10 upon reaching time t5. In a period from time t5 to time t6, when the load LOAD is turned on, as each cell contained in the load LOAD is turned on, the boost output voltage Vb6H supplied from the boost output terminal BOOT having a finite output resistance component which cannot be negligible decreases to a voltage Vb6M.

An amount of decrease in the output voltage Vbo6 varies little by little depending on the number of columns of memory cells CELL are coupled to the load LOAD. In the embodiment of the present disclosure, as a result of a comparison between a 32-column memory cell CELL and a 128-column memory cell CELL, it is found that there is a difference of less than about 0.1V between both. For example, if the boost output voltage Vbo6 is 2.80V for the 32-column memory cell CELL, then the boost output voltage Vbo6 is 2.72V for the 128-column memory cell CELL, resulting in a difference of 80 mV between both.

The graph of (f) of FIG. 10 shows the word line signal WL output from the load LOAD, as described a little earlier. A generation timing of the word line signal WL is determined in view of the generation timings of the pulses P4 and P5 and the behavior of the boost output voltage v20d of the node N20D.

The bootstrap circuit according to the above embodiments of the present disclosure can be configured with a relatively simple structure and can precisely adjust a boost voltage. Therefore, the present disclosure has high industrial applicability.

Also, according to the present disclosure in some embodiments, it is possible to provide a bootstrap circuit which is capable of adjusting a boost voltage with ease.

While certain embodiments have been described, these embodiments have been presented by way of example only, and are not intended to limit the scope of the disclosures. Indeed, the novel methods and apparatuses described herein may be embodied in a variety of other forms; furthermore, various omissions, substitutions and changes in the form of the embodiments described herein may be made without departing from the spirit of the disclosures. The accompanying claims and their equivalents are intended to cover such forms or modifications as would fall within the scope and spirit of the disclosures.

What is claimed is:

1. A bootstrap circuit comprising:
   a first transistor of a first conductivity type having a first main electrode, a second main electrode and a control electrode which are connected to a first power supply terminal, a first node, and a second node, respectively;
   a second transistor of the first conductivity type having a first main electrode, a second main electrode, and a control electrode which are connected to the first power supply terminal, the second node and the first node, respectively;
   a first capacitor having a first end connected to the first node and a second end to which a first boost pulse is applied;
   a second capacitor having a first end connected to the second node and a second end to which a second boost pulse having the opposite polarity to the first boost pulse is applied; and
   a boost output terminal which outputs a boost voltage higher than a first power supply voltage supplied to the first power supply terminal coupled to the second node,
   wherein a first resistor is connected between the first node and the first power supply terminal, and a second resistor is connected between the second node and the first power supply terminal,
   wherein at least one of the first resistor and the second resistor is configured in combination of a plurality of unit resistive elements having predetermined unit resistance,
   wherein at least one of a first resistance of the first resistor and a second resistance of the second resistor is adjustable, and
   wherein an adjustable range of the second resistance of the second resistor is wider than an adjustable range of the first resistance of the first resistor.

2. The bootstrap circuit of claim 1, wherein an anode of a diode is connected to the first node, a cathode of the diode is connected to the second node, and the second node is connected to the boost output terminal.

3. The bootstrap circuit of claim 1, further comprising:
   a third transistor of a second conductivity type having a first main electrode, a second main electrode and a control electrode which are connected to the boost output terminal, the first node and the second node, respectively; and
   a fourth transistor of the second conductivity type having a first main electrode, a second main electrode and a control electrode which are connected to the boost output terminal, the second node and the first node, respectively.

4. The bootstrap circuit of claim 1, wherein the first resistor and the second resistor are fabricated in a semiconductor integrated circuit device and an adjustment of at least one of the first resistance of the first resistor and the second resistance of the second resistor is performed in at least one of a focused ion beam and a wiring process of the semiconductor integrated circuit device.

5. The bootstrap circuit of claim 1, wherein at least one of the first capacitor and the second capacitor is configured in combination of a plurality of unit capacitors having a predetermined unit capacitance.

6. The bootstrap circuit of claim 5, wherein at least one of a first capacitance of the first capacitor and a second capacitance of the second capacitor is adjustable.

7. The bootstrap circuit of claim 6, wherein an adjustable range of the second capacitance of the second capacitor is wider than an adjustable range of the first capacitance of the first capacitor.

8. The bootstrap circuit of claim 5, wherein the first capacitor and the second capacitor are fabricated in a semiconductor integrated circuit device and adjustment of at least one of a first capacitance of the first capacitor and a second capacitance of the second capacitor is performed in at least one of a focused ion beam and a wiring process of the semiconductor integrated circuit device.

9. The bootstrap circuit of claim 1, wherein a word line driver is coupled to the boost output terminal.

10. The bootstrap circuit of claim 9, wherein a diode having an anode connected to a second power supply terminal and a cathode connected to the boost output terminal is connected between the boost output terminal and the second power supply terminal.

11. The bootstrap circuit of claim 10, wherein a second power supply voltage applied to the second power supply terminal is equal to or higher than the first power supply voltage.

12. A bootstrap circuit comprising:
    a first transistor of a first conductivity type having a first main electrode, a second main electrode and a control electrode which are connected to a first power supply terminal, a first node, and a second node, respectively;
    a second transistor of the first conductivity type having a first main electrode, a second main electrode, and a control electrode which are connected to the first power supply terminal, the second node and the first node, respectively;
    a first capacitor having a first end connected to the first node and a second end to which a first boost pulse is applied;
    a second capacitor having a first end connected to the second node and a second end to which a second boost pulse having the opposite polarity to the first boost pulse is applied; and
    a boost output terminal which outputs a boost voltage higher than a first power supply voltage supplied to the first power supply terminal coupled to the second node,
    wherein at least one of the first capacitor and the second capacitor is configured in combination of a plurality of unit capacitors having a predetermined unit capacitance,
    wherein at least one of a first capacitance of the first capacitor and a second capacitance of the second capacitor is adjustable, and
    wherein an adjustable range of the second capacitance of the second capacitor is wider than an adjustable range of the first capacitance of the first capacitor.

13. The bootstrap circuit of claim 12, wherein an anode of a diode is connected to the first node, a cathode of the diode is connected to the second node, and the second node is connected to the boost output terminal.

14. The bootstrap circuit of claim 12, further comprising:
a third transistor of a second conductivity type having a first main electrode, a second main electrode and a control electrode which are connected to the boost output terminal, the first node and the second node, respectively; and
a fourth transistor of the second conductivity type having a first main electrode, a second main electrode and a control electrode which are connected to the boost output terminal, the second node and the first node, respectively.

15. The bootstrap circuit of claim 12, wherein a first resistor is connected between the first node and the first power supply terminal and a second resistor is connected between the second node and the first power supply terminal.

16. The bootstrap circuit of claim 15, wherein at least one of the first resistor and the second resistor is configured in combination of a plurality of unit resistive elements having predetermined unit resistance.

17. The bootstrap circuit of claim 16, wherein at least one of a first resistance of the first resistor and a second resistance of the second resistor is adjustable.

18. The bootstrap circuit of claim 16, wherein the first resistor and the second resistor are fabricated in a semiconductor integrated circuit device and an adjustment of at least one of a first resistance of the first resistor and a second resistance of the second resistor is performed in at least one of a focused ion beam and a wiring process of the semiconductor integrated circuit device.

19. The bootstrap circuit of claim 12, wherein the first capacitor and the second capacitor are fabricated in a semiconductor integrated circuit device and adjustment of at least one of the first capacitance of the first capacitor and the second capacitance of the second capacitor is performed in at least one of a focused ion beam and a wiring process of the semiconductor integrated circuit device.

20. The bootstrap circuit of claim 12, wherein a word line driver is coupled to the boost output terminal.

* * * * *